(12) United States Patent
Jin et al.

(10) Patent No.: US 7,231,557 B2
(45) Date of Patent: Jun. 12, 2007

(54) METHODS AND APPARATUS FOR INTERLEAVING IN A BLOCK-COHERENT COMMUNICATION SYSTEM

(75) Inventors: Hui Jin, Annendale, NJ (US); Tom Richardson, South Orange, NJ (US); Vladimir Novichkov, Towaco, NJ (US)

(73) Assignee: QUALCOMM Incorporated, San Diego, CA (US)

( * ) Notice: Subject to any disclaimer, the term of this patent is extended or adjusted under 35 U.S.C. 154(b) by 164 days.

(21) Appl. No.: 10/637,844

(22) Filed: Aug. 8, 2003

(65) Prior Publication Data

US 2004/0216024 A1    Oct. 28, 2004

Related U.S. Application Data

(60) Provisional application No. 60/459,677, filed on Apr. 2, 2003.

(51) Int. Cl.
*H03M 13/13* (2006.01)
*H03M 13/27* (2006.01)

(52) U.S. Cl. ................................ 714/701; 714/780
(58) Field of Classification Search ............. 714/701, 714/702, 780
See application file for complete search history.

(56) References Cited

U.S. PATENT DOCUMENTS

| | | | |
|---|---|---|---|
| 3,542,756 A | 11/1970 | Gallager | |
| 3,665,396 A | 5/1972 | Forney, Jr. | |
| 4,295,218 A | 10/1981 | Tanner | |
| 5,157,671 A | 10/1992 | Karplus | |
| 5,271,042 A | 12/1993 | Borth et al. | |
| 5,293,489 A | 3/1994 | Furui et al. | |
| 5,313,609 A | 5/1994 | Baylor et al. | |
| 5,392,299 A * | 2/1995 | Rhines et al. | ............... 714/756 |
| 5,396,518 A | 3/1995 | How | |
| 5,457,704 A | 10/1995 | Hoeher et al. | |
| 5,526,501 A | 6/1996 | Shams | |
| 5,615,298 A | 3/1997 | Chen | |
| 5,671,221 A | 9/1997 | Yang | |
| 5,742,612 A * | 4/1998 | Gourgue et al. | ............ 714/701 |
| 5,860,085 A | 1/1999 | Stormon et al. | |
| 5,864,703 A | 1/1999 | van Hook et al. | |
| 5,867,538 A | 2/1999 | Liu | |
| 5,892,962 A | 4/1999 | Cloutier | |
| 5,933,650 A | 8/1999 | van Hook et al. | |
| 5,968,198 A | 10/1999 | Hassan et al. | |
| 6,002,881 A | 12/1999 | York et al. | |
| 6,073,250 A | 6/2000 | Luby et al. | |
| 6,195,777 B1 | 2/2001 | Luby et al. | |
| 6,247,158 B1 | 6/2001 | Smallcomb | |

(Continued)

OTHER PUBLICATIONS

Kong et al., "Interleaved Cyclic Redundancy Check (CRC) Code", ACSSC 2003, Nov. 2003, pp. 2137-2141.*

(Continued)

*Primary Examiner*—Stephen M. Baker
(74) *Attorney, Agent, or Firm*—Straub & Pokotylo; Michael P. Straub

(57) ABSTRACT

Methods and apparatus for communication over a block-coherent communication system are described. The present invention is directed to methods of interleaving coded bits that are encoded by codes, e.g., LDPC codes, having graph structures largely comprised, e.g., of multiple identical copies of a much smaller graph.

21 Claims, 8 Drawing Sheets

U.S. PATENT DOCUMENTS

| | | | |
|---|---|---|---|
| 6,266,758 | B1 | 7/2001 | van Hook et al. |
| 6,298,438 | B1 | 10/2001 | Thayer et al. |
| 6,339,834 | B1 | 1/2002 | Crozier et al. |
| 6,397,240 | B1 | 5/2002 | Fernando et al. |
| 6,438,180 | B1 | 8/2002 | Kavcic et al. |
| 6,473,010 | B1 | 10/2002 | Vityaev et al. |
| 6,484,284 | B2 | 11/2002 | Smallcomb |
| 6,490,705 | B1 * | 12/2002 | Boyce .................. 714/776 |
| 6,526,538 | B1 | 2/2003 | Hewitt |
| 6,633,856 | B2 | 10/2003 | Richardson et al. |
| 6,718,504 | B1 | 4/2004 | Coombs et al. |
| 6,731,700 | B1 | 5/2004 | Yakhnich et al. |
| 6,754,804 | B1 | 6/2004 | Hudepohl et al. |
| 2004/0035828 | A1 | 2/2004 | Hocevar |

OTHER PUBLICATIONS

Richardson et al. The capacity of low-density parity-check codes under message-passing Decoding, IEEE Transactions on Information Theory; pp. 599-618, Feb. 2001, (same inventor) whole document.

Paranchych et al. Performance of a digital symbol synchronizer in cochannel interference and noise, IEEE Transactions on Communications, pp. 1945-1954; Nov. 2000, whole document.

NN77112415. Digital Encoding of Wide Range Dynamic Analog Signals, IBM Tech. Disclosure Bulletin, Nov. 1, 1997, vol. No. 20; Issue No. 6; pp. 2415-2417, whole document.

NN9210335. Hierarchical Coded Modulation of Data with Fast Decaying Probability Distributions, IBM Tech. Disclosure Bulletin, Oct. 1992, vol. No. 35; Issue No. 5; pp. 335-336, whole document.

Sorokine, V. et al. Innovative coding scheme for spread-spectrum communications, The Ninth IEEE International Symposium on Indoor and Mobile Radio Communications, pp. 1491-1495, vol. 3; Sep. 1998, whole document.

T. Moors and M. Veeraraghavan, "Preliminary specification and explanation of Zing: An end-to-end protocol for transporting bulk data over optical circuits", pp. 1-55 (May 2001).

T. Richardson and R. Urbanke, "The Capacity of Low-Density Parity-Check Codes under Message-Passing Decoding", pp. 1-44 (Mar. 2001).

T. Richardson, A. Shokrollahi, R. Urbanke, "Design of Capacity-Approaching Irregular Low-Density Parity-Check Codes", pp. 1-43 (Mar. 2001).

T. Richardson and R. Urbanke, "An Introduction to the Analysis of Iterative Coding Systems", pp. 1-36.

Saied Hemati, Amir H. Banihashemi, VLSI circuits: Iterative decoding in analog CMOS, Proceedings of the 13$^{th}$ ACM Great Lakes Symposium on VLSI Apr. 2003, pp. 15-20.

Mohammad M. Mansour, Naresh R. Shanbhag, Session 11: Low-power VLSI decoder architectures for LDPC codes, Proceedings of the 2002 international symposium on Low power electronics and design Aug. 2002, pp. 284-289.

R. Blahut, "Theory and Practice of Error Control Codes", Library of Congress Cataloging in Publication Data, pp. 47-49, (May 1984).

W. W. Peterson and E.J. Weldon, Jr., "Error-Correcting Codes", Second Edition, The Massachusetts Institute of Technology, pp. 212-213, 261-263, 263, (1986).

* cited by examiner

METHODS AND APPARATUS FOR INTERLEAVING IN A BLOCK-COHERENT COMMUNICATION SYSTEM

RELATED APPLICATIONS

The present application claims the benefit of U.S. Provisional Patent Application Ser. No. 60/459,677, filed Apr. 2, 2003 titled "METHODS AND APPARATUS FOR DATA TRANSMISSION IN A BLOCK-COHERENT COMMUNICATION SYSTEM".

FIELD OF THE INVENTION

The present invention is directed to methods and apparatus for data communication over a block-coherent channel and, more particularly, to methods and apparatus for accessing and/or interleaving data bits coded by parity check codes, e.g., low-density parity-check (LDPC) codes.

BACKGROUND

A communication system requires noncoherent detection when it is infeasible for the receiver to maintain a reliable estimate for instantaneous channel gain (magnitude and, especially, phase). Noncoherent communication systems include, for instance, a wireless multiple access system where the mobile, having limited power, cannot afford to transmit high power known symbols (pilots) to enable reliable channel estimation. A noncoherent communication channel may possess some coherence property: A coherent block is a time interval during which the channel variations are negligibly small. Communication over such a channel is referred to as block-coherent communication.

Block-coherent communication may arise naturally in fast frequency-hopping orthogonal frequency division multiple (OFDM) access systems. In such systems information may be modulated onto a subset of available frequencies, called tones, in every symbol time. To enhance spectral efficiency and increase diversity gain, tones utilized are, in some cases, rapidly hopped across the entire utilized frequency band in every L symbols, i.e., L consecutive symbols are mapped to one tone, followed by another L symbols mapped to a different tone, and so on. When L is small, we can assume consecutive L symbols experience identical channel gain. Although the amplitudes of the gains of two consecutive L symbols can be close, their phases are normally completely independent.

More precisely, a block-coherent communication system can be defined as follows: for a system represented in discrete time domain, the channel gain is an unknown complex random variable that remains the same for every L consecutive symbols but otherwise varies independently according to some distribution, e.g., the phase is uniformly distributed over [0, 2PI] and the magnitude is Rayleigh distributed.

For block-coherent communication the nominal modulation scheme is differential M-array phase-shift-keying (DMPSK). DMPSK carries the information in the phase differences between two successive symbols over the coherent block. For illustration, to transmit N×(L−1) MPSK information symbols s(i), each of the N consecutive sets of L−1 symbols, denoted as s(1), s(2), . . . , s(L−1), are differentially encoded to transmitted symbols t(1), t(2), . . . , t(N), where t(1)=1, and t(j+1)=t(j)×s(j) for j=1, . . . , N−1.

Modulations other than DMPSK are possible. For instance, with the insertion of known symbols in a block, information symbols may be transmitted directly on other symbols instead of differentially. This may be referred to as pseudo-pilot modulation. It is apparent, however, that at most L−1 information symbols can be transmitted inside a dwell of length L due to the phase uncertainty. In general we assume there are M information symbols transmitted in each dwell, which can be regarded as a transmission unit. In other words, each transmission unit includes L–M known symbols. M is at most L−1. For instance, both schemes mentioned have M=L−1.

With forward error-correction coding a block-coherent communication system will normally include an encoder (which inserts structured redundancy into original data stream), a DMPSK modulator (which maps binary data bits to MPSK symbols), a demodulator (which extracts out soft information differentially and feeds it to the decoder), and a decoder (which decodes the original message based on soft information from the demodulator).

In most coded systems, a receiver applying iterative demodulation and decoding—a scheme henceforth referred to as turbo equalization—has significant performance gain over a non-iterative receiver. For instance, convolution and/or turbo coded DMPSK systems, investigated by Shamai et al. in "Iterative decoding for coded noncoherent MPSK communications over phase-noisy AWGN channel" published in IEE Proceedings Communication 2000, demonstrates turbo-equalization performance within 1.3 dB of channel capacity and 1 dB better than traditional schemes.

It has been shown that for turbo equalization to be maximally effective, the code design needs to take the effect of iterative demodulation into account. The necessity of code design and an effective way of achieving it are described in Jin and Richardson's paper "Design of Low-Density Parity-Check Codes in Noncoherent Communication," published in International symposium on information theory Jun. 30, 2002. The approach therein improves the performance to within 0.7 dB of channel capacity.

For optimal performance of turbo equalization, the coded bits also should be sufficiently interleaved in transmission. The interleaving serves two purposes. On one hand, it can effectively eliminate the correlation among soft-messages associated with coded bits of small distance in the block structure for decoding purposes. On the other hand, interleaving can eliminate the dependence among the soft values feed back to the same coherent block for demodulation. A commonly conceived interleaving structure is random interleaving. To achieve random interleaving, however, the same (randomly generated) permutation must be accessible, e.g., stored, at both the transmitter and the receiver. This inflicts large memory requirements for practical systems coded by large block codes.

While the performance of turbo equalization is important, for a communication system to be practical for use in a wide range of devices, e.g., consumer devices, it is important that the turbo equalizations be capable of being implemented at reasonable cost. Accordingly, the ability to efficiently implement turbo equalization schemes used for a block-coherent communication system, e.g., in terms of hardware costs, can be important.

The usage of LDPC codes as a coding scheme in block-coherent communication is desirable given its near-capacity coding gain and rich design space.

LDPC codes are often represented by bipartite graphs, called Tanner graphs, in which one set of nodes, the variable nodes, correspond to bits of the codeword and the other set of nodes, the constraint nodes, sometimes called check nodes, correspond to the set of parity-check constraints which define the code. Edges in the graph connect variable nodes to constraint nodes. A variable node and a constraint node are said to be neighbors if they are connected by an edge in the graph. For simplicity, we generally assume that a pair of nodes is connected by at most one edge.

A bit sequence associated one-to-one with the variable nodes is a codeword of the code if and only if, for each constraint node, the bits neighboring the constraint (via their association with variable nodes) sum to zero modulo two, i.e., they comprise an even number of ones.

The number of edges attached to a node, i.e., a variable node or a constraint node, is referred to as the degree of the node. A regular graph or code is one for which all variable nodes have the same degree, j say, and all constraint nodes have the same degree, k say. In this case we say that the code is a (j,k) regular code. These codes were originally invented by Gallager (1961). In contrast to a "regular" code, an irregular code has constraint nodes and/or variable nodes of differing degrees. For example, some variable nodes may be of degree 4, others of degree 3 and still others of degree 2.

While irregular codes can be more complicated to represent and/or implement, it has been shown that irregular LDPC codes can provide superior error correction/detection performance when compared to regular LDPC codes.

An exemplary bipartite graph 200 determining a (3,6) regular LDPC code of length ten and rate one-half is shown in FIG. 2. Length ten indicates that there are ten variable nodes $V_1-V_{10}$, each identified with one bit of the codeword $X_1-X_{10}$, the set of variable nodes $V_1-V_{10}$ is generally identified in FIG. 2 by reference numeral 202. Rate one half indicates that there are half as many check nodes as variable nodes, i.e., there are five check nodes $C_1-C_5$ identified by reference numeral 206. Rate one half further indicates that the five constraints are linearly independent, as discussed below.

While FIG. 2 illustrates the graph associated with a code of length 10, it can be appreciated that representing the graph for a codeword of length 1000 would be 100 times more complicated.

The practical challenges posed by turbo equalization, in the light of implementation cost, are the complexity of soft-in soft-out (SISO) demodulator and the data interleaving at the transmitter and the receiver. There remains a need for improved interleaving techniques and/or implementation. The present invention is directed to implementing an interleave in an efficient manner. The data interleaving techniques of the present invention are well suited for use with data bits encoded, e.g., by Low Density Parity Check (LDPC) codes.

SUMMARY OF THE INVENTION

Figure 1:
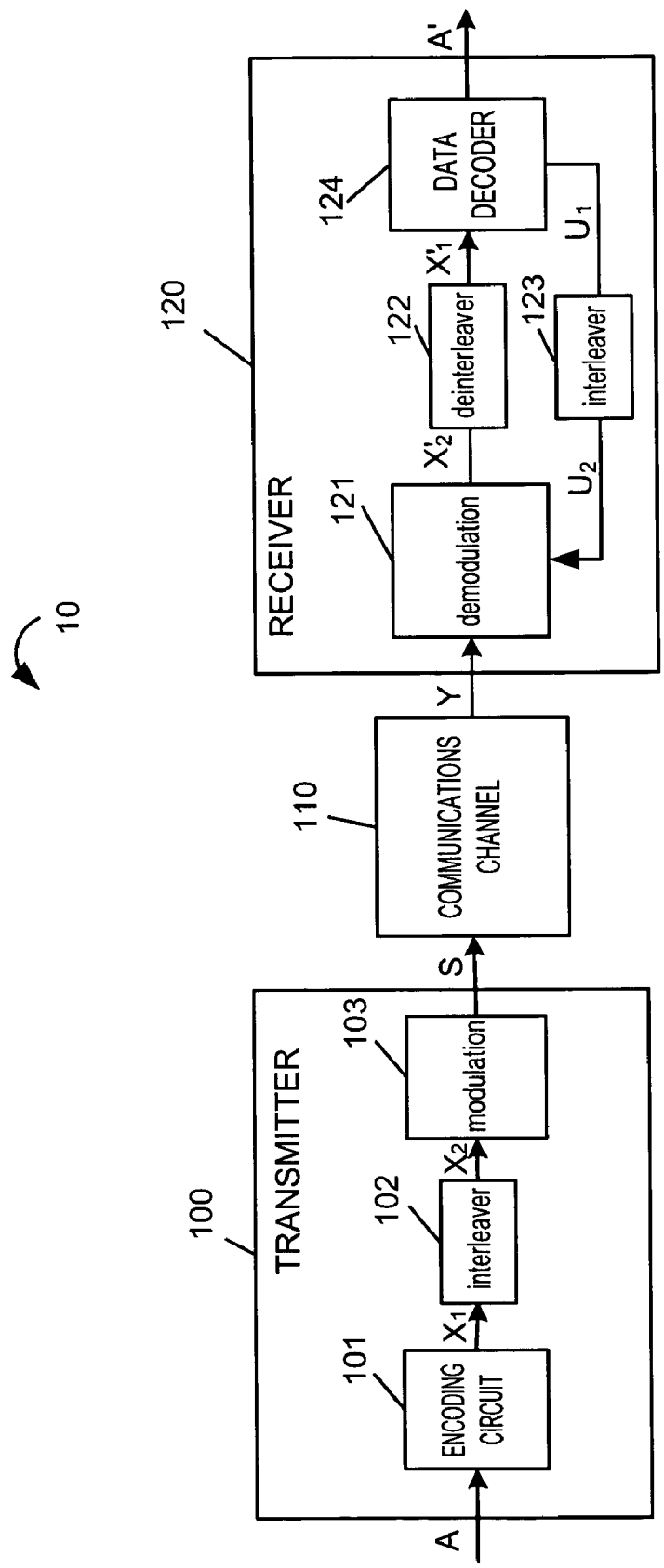
FIG. 1 illustrates an exemplary communication system including an encoder, an interleaver, a modulator, a channel, a demodulator, a deinterleaver, and a decoder in which the methods and apparatus of the present invention are employed.
Figure 2:
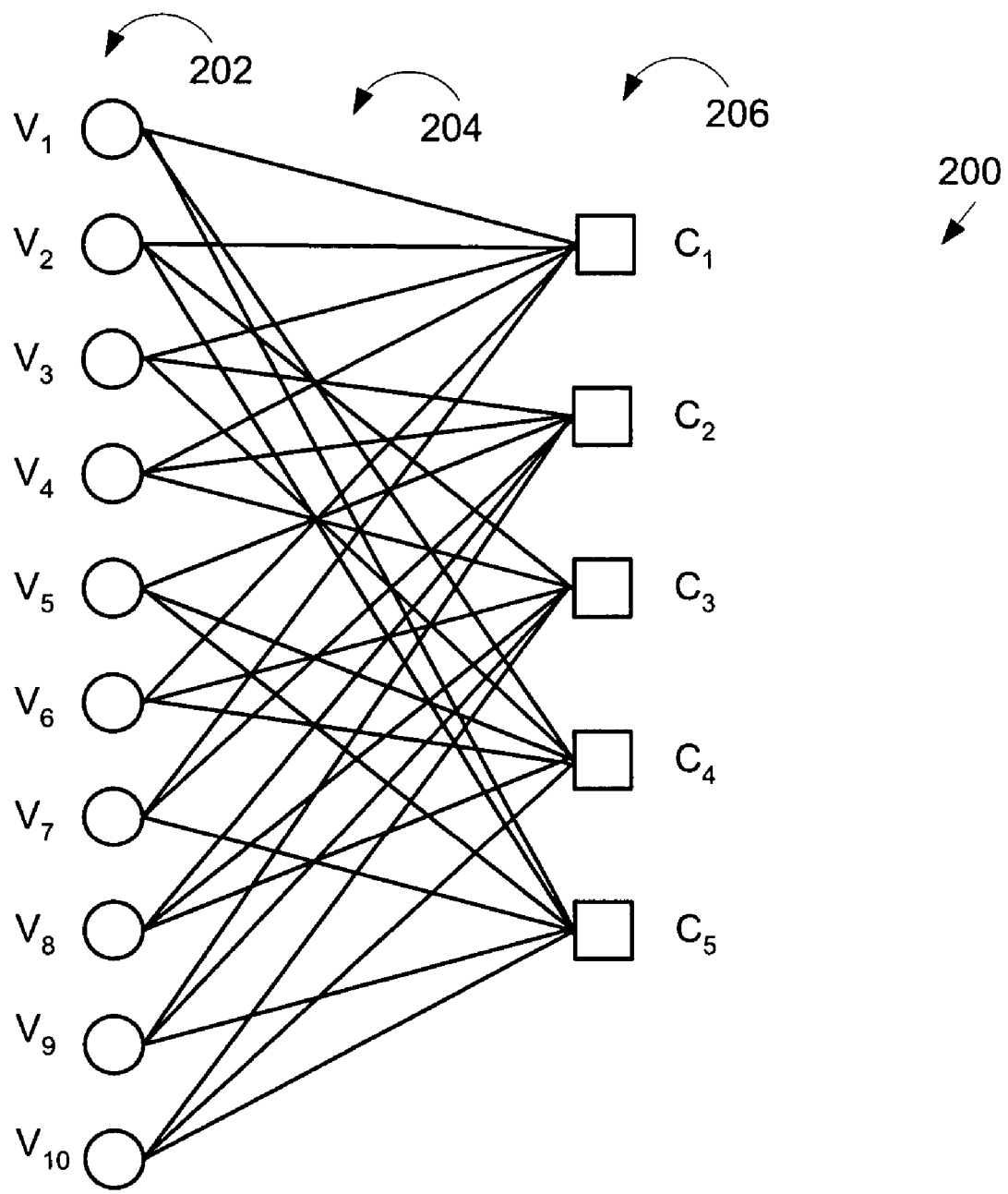
FIG. 2 illustrates a bipartite graph representation of an exemplary regular LDPC code of length ten.

The present invention is directed to methods and apparatus for data communication over a block-coherent channel. For simplicity, we refer to the symbols transmitted in one coherent interval as a dwell. The length of a dwell is L. The symbols of a dwell, serve as an information transmission unit, that includes M information symbols and (L–M) known symbols. Each information symbol is a symbol mapped from P bit(s) in a codeword.

The present invention is directed to methods and apparatus for algebraically interleaving coded bits between the encoder and modulator at the transmitter with the use of no or relatively little memory. The present invention is also directed to methods and apparatus for algebraically interleaving soft messages between a decoder and demodulator at the receiver with no or relatively little memory.

For purposes of explaining the present invention, we assume QPSK as the modulation constellation. With this assumption, one transmission symbol uses two coded bits—a dibit. The techniques described in the present invention, however, can be easily generalized and are applicable to high order modulation schemes, e.g. MPSK or QAM with such implementations being deemed within the scope of the present invention.

The present invention of algebraic interleaving is directed to data bits encoded by LDPC codes that possess a certain hierarchical structure in which a full LDPC graph appears to be, in large part, made up of multiple copies, Z say, of a Z times smaller graph.

The Z graph copies may be identical. To be precise we will refer to the smaller graph as the projected graph. We refer to the Z parallel edges as vector edges, and Z parallel nodes as vector nodes. In a previous application, U.S. patent application Ser. No. 09/975,331 titled "Methods and Apparatus for Performing LDPC Code Encoding and Decoding", filed Oct. 10, 2001, which is hereby expressly incorporated by reference, the benefits that such a structure lends to decoder implementation were described. A key observation is that all operations may be done in parallel across all copies. The Z copies are not disjoint, however, they are combined to form one large graph, Z times larger than the projected graph. This is accomplished by interconnecting the Z copies of the projected graph in a controlled manner. Specifically, we allow the Z edges within a vector edge to undergo a permutation, or exchange, between copies of the projected graph as they go, e.g., from the variable node side to the constraint node side. In the vectorized encoding process corresponding to the Z parallel projected graphs, we allow the Z bits within a vector corresponding to a projected variable node to undergo a permutation.

The objective of interleaving between coding and modulation is to mitigate correlation between soft messages (values) corresponding to coded bits of short distance inside the LDPC graph. In addition, it may be equally desirable that the interleaving may create structures that assist turbo equalization. For this purpose, the coded bits inside a dwell are preferred to have a wide range of degrees, because it is known that the convergence speed of nodes of different degrees vary significantly in the decoding process. When decoded successfully in earlier phases, bits associated with high degrees can generate more reliable estimation on the unknown phase inside a dwell. This generally improves the soft messages generated on its neighboring symbols inside the dwell, which in turn assists the decoder more effectively.

This desirable property of a dwell having a wide-range mixture of node degrees can be readily implemented when data bits are encoded by vector-LDPC codes, which possess an exploitable structure. If the memory storing those encoded bits is configured as a matrix of Z x n, then the bits in the same column (physically the same address) correspond to the same node in the projected graph and thus have the same degree.

Coded bits are stored in memory configured as Z×n. Or equivalently, we view the binary codeword as n Z-vectors, each vector including Z bits. The Z used in vector LDPC codes is a multiple of P, the number of bits associated with a transmitted symbol. For assumed QPSK modulation where P=2, we have Z=2z, where z is the number of symbol's-worth of bits in a Z-vector. We further select the number of columns to be a multiple of M, the number of information transmission symbols in a transmission unit, i.e. n=aM.

The vectorized encoding process, as described in the U.S. Pat. No. 6,961,888 titled "METHODS AND APPARATUS FOR ENCODING LDPC CODES" filed Jul. 11, 2003, may arrange these columns such that the degrees of their associated variable nodes are in an increasing order. Such an ordering facilitates an algebraic interleaving method that forms dwells with coded bits associated with variable nodes of wide range of degrees. An exemplary way is to uniformly divide the matrix into M=L−1 contiguous sub-matrices. The property that columns are ordered in increasing degree ensures that the sub-matrices contain variable nodes of similar degrees: the first sub matrix has the lowest degree, the last sub matrix the highest. Thus a dwell formed by taking two bits from different sub-matrices has the desired property.

Interleaving of the coded bits, implemented in accordance with the present invention may be performed as discussed below.

An exemplary interleaver apparatus of the invention includes a memory for storing coded bits and an interleaving circuit. The interleaving circuit generates a set of control information which is used to control the reading of bits from the memory. Each set of generated control information includes a transmission unit identifier, a Z vector identifier, and a row identifier. The control circuit, in an exemplary embodiment, includes four components: a symbol ID generation module, a bits ID generation module, a column ID generation module and a control information generator module. The symbol ID generation module may be implemented as a repeating counter that generates a number s ranging from 0 to M−1. The repeating counter is incremented periodically as a function of a system clock clk, e.g., s is incremented once per clock cycle; the number s determines the symbol index in a dwell. The bits ID generation module may also be implemented as a repeating counter, e.g., a repeating counter generating a number b ranging from 0 to z−1. The number b is periodically incremented each time the symbol index signal s reaches zero; number b determines the bits index in a selected column. Column ID generation module 603 generates a number c ranging from 0 to a−1 and may be implemented as another counter. The number c is incremented each time the bits index b reaches zero; number c is the column index. Taking bits index b, symbol index s, and column index c, a control information generator module produces a set of control information including a transmission unit identifier, a Z vector identifier and a row identifier used to control which location in the coded bits memory is accessed. In one exemplary embodiment, the Z-vector identifier is c+a×s, and the row identifier is 2×b. The transmission unit is identified by a transmission unit identifier having the value b+c×Z, where b and c are as defined above and where Z is the number of elements in each Z vector and where x indicates a multiplication operation.

At the receiver side, the direct mapping between data bits and transmission units is conformed for demodulation. It is assumed that soft-outputs from the decoder have the same ordering as the binary code word structure. The soft values includes, however, K-bits corresponding to a coded bit. Each of k bits may be stored in a different one of D arrays in memory where D is a positive integer. In most cases, K is an integer multiple of D. One exemplary memory has three-bit soft values for each bit, each identified by the same code bit identifier. Those three bits might be in one memory location; or those three bits could be in three different memory location. With this structure, it is clear that the same type of interleaving apparatus used in a transmitter can also be used in a receiver to access soft values corresponding to a transmission unit for purposes of demodulation.

Assuming the received values also conform to the same ordering as a code word, then again the same interleaving structure can be applied in the process of accessing received values for demodulation.

Numerous additional embodiments, features and benefits of the methods and apparatus of the invention are discussed in the detailed description which follows.

DETAILED DESCRIPTION OF THE INVENTION

FIG. 1 illustrates a general-purpose communication system 10 which implements the present invention. The system 10 includes a transmitter 100 which is coupled by a communication channel 110 to a receiver 120. The transmitter 100 comprises a data encoding circuit, e.g., an encoder 101, an interleaver 102, and a modulator 103. The receiver comprises a demodulator 121, a deinterleaver 122, an interleaver 123, and a data decoder 124. The encoder 101 maps an input binary data stream A to a structured binary data stream XI with redundancy. The interleaver 102 interleaves $X_1$ to another data stream $X_2$. The modulator 103 transforms the binary stream $X_2$ to physical signals feasible for practical transmission, e.g. QPSK signals. The communications channel 110 may be, e.g., an air link. Modulated signals are transmitted through the channel 110 to the receiver 120. At the receiver side, demodulator 121 extracts information $X_2'$ from the noisy distorted reception Y. The deinterleaver 122 reorders the soft messages $X_2'$ to $X_1'$ corresponding to the original ordering of the code structure. And the decoder 123 tries to recover the original binary data stream A through the use of redundancy present in the coded data stream $X_1'$ produced by demodulation. The data path from decoder 123 to demodulation 121 represents a feedback loop. The feedback messages should be interleaved by an interleaver 124 to transform the ordering at the code to the ordering at the modulation.

Figure 3:
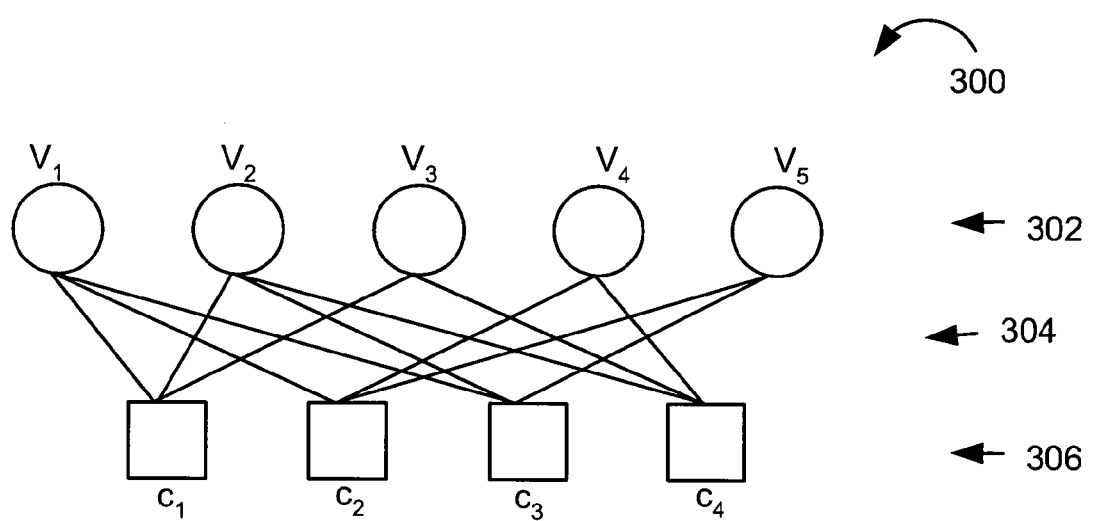
FIG. 3 is a graphical representation of a small LDPC code that is used as the basis of a much larger LDPC code to present an example in accordance with the present invention.

FIG. 3 illustrates a simple irregular LDPC code in the form of a graph 300. The code is of length five as indicated by the 5 variable nodes $V_1$ through $V_5$ 302. Four check nodes $C_1$ through $C_4$ 306 are coupled to the variable nodes 302 by a total of 12 edges 304.

Figure 4:
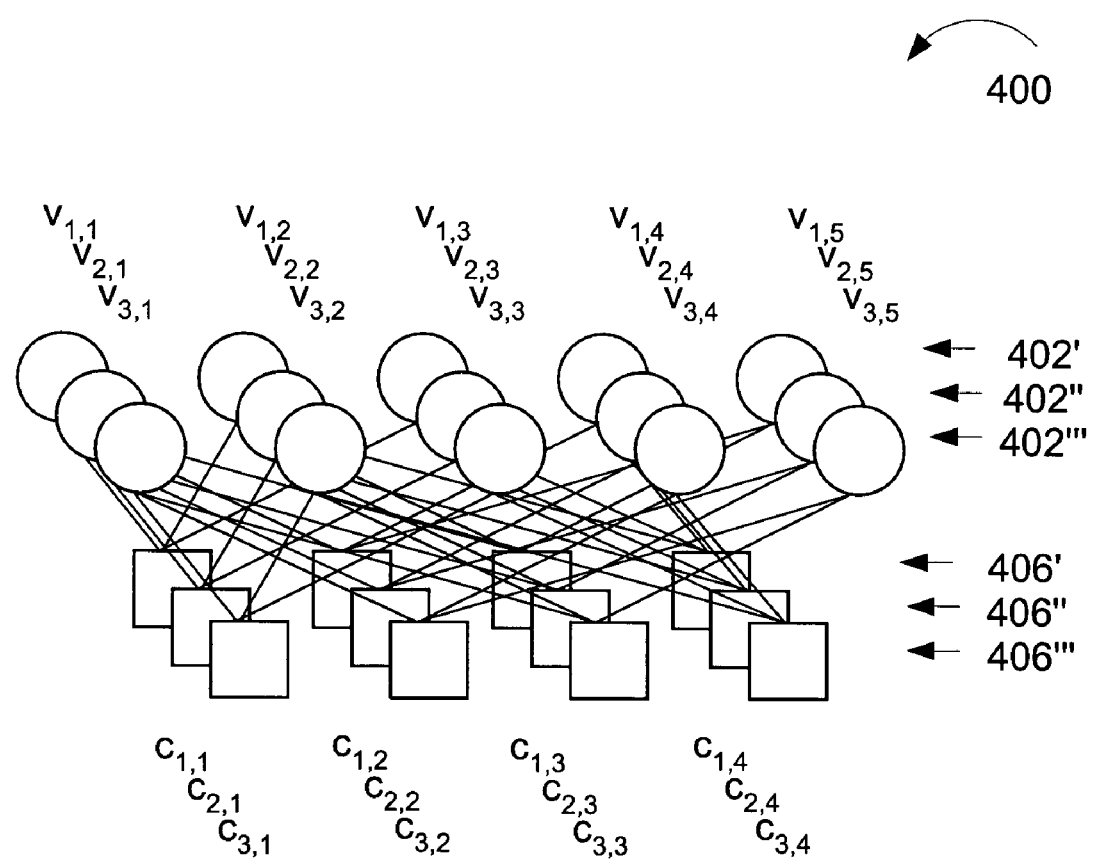
FIG. 4 graphically illustrates the effect of making three copies of the small LDPC graph shown in FIG. 3.

FIG. 4 is a graph 400 illustrating the result of making 3 parallel copies of the small graph illustrated in FIG. 3. Variable nodes 402', 402" and 402'" correspond to the first through third graphs, respectively, resulting from making three copies of the FIG. 3 graph. In addition, check nodes 406', 406" and 406'" correspond to the first through third graphs, respectively, resulting from making the three copies. Note that there are no edges connecting nodes of one of the three graphs to nodes of another one of the three graphs. Accordingly, this copying process, which "lifts" the basic graph by a factor of 3, results in three disjoint identical graphs. (Normally the 3 copies are interconnected by permuting vector edges.)

We will now proceed by describing the algebraic interleaving of the coded bits, implemented in accordance with the present invention.

An interleaving method of the invention determines the location of the 2 bits associated with each symbol in each transmission unit. Clearly, the memory location corresponding to a Z-vector identifier and the bit index inside the Z-vector. The present invention orders coded data as follows: The jth dwell (where j is from 0 to z×a−1) will contain 2 bits in the Z vector identified by [j/z]+a+1 with bit index 2* (j mod Z/P), where i is from 0 to M−1. In such a case, the address used to retrieve the data bits can be easily generated algebraically, without the use of memory for this purpose.

Figure 5:
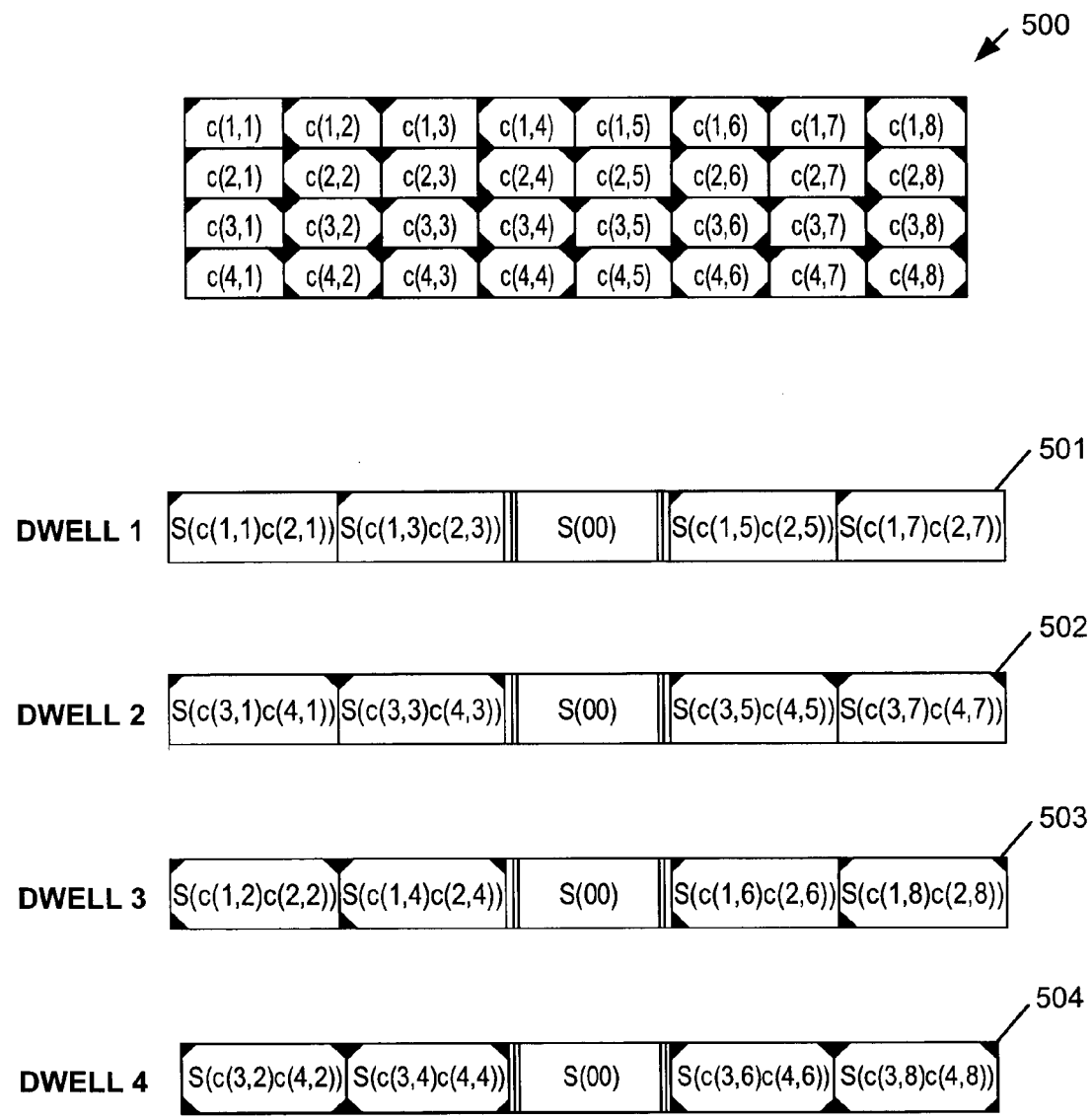
FIG. 5 illustrates the result of algebraic interleaving by using an exemplary 4×8 LDPC code in accordance with the present invention. In particular, it illustrates the direct mapping of coded data bits to a portion of a transmission unit.
Figure 6:
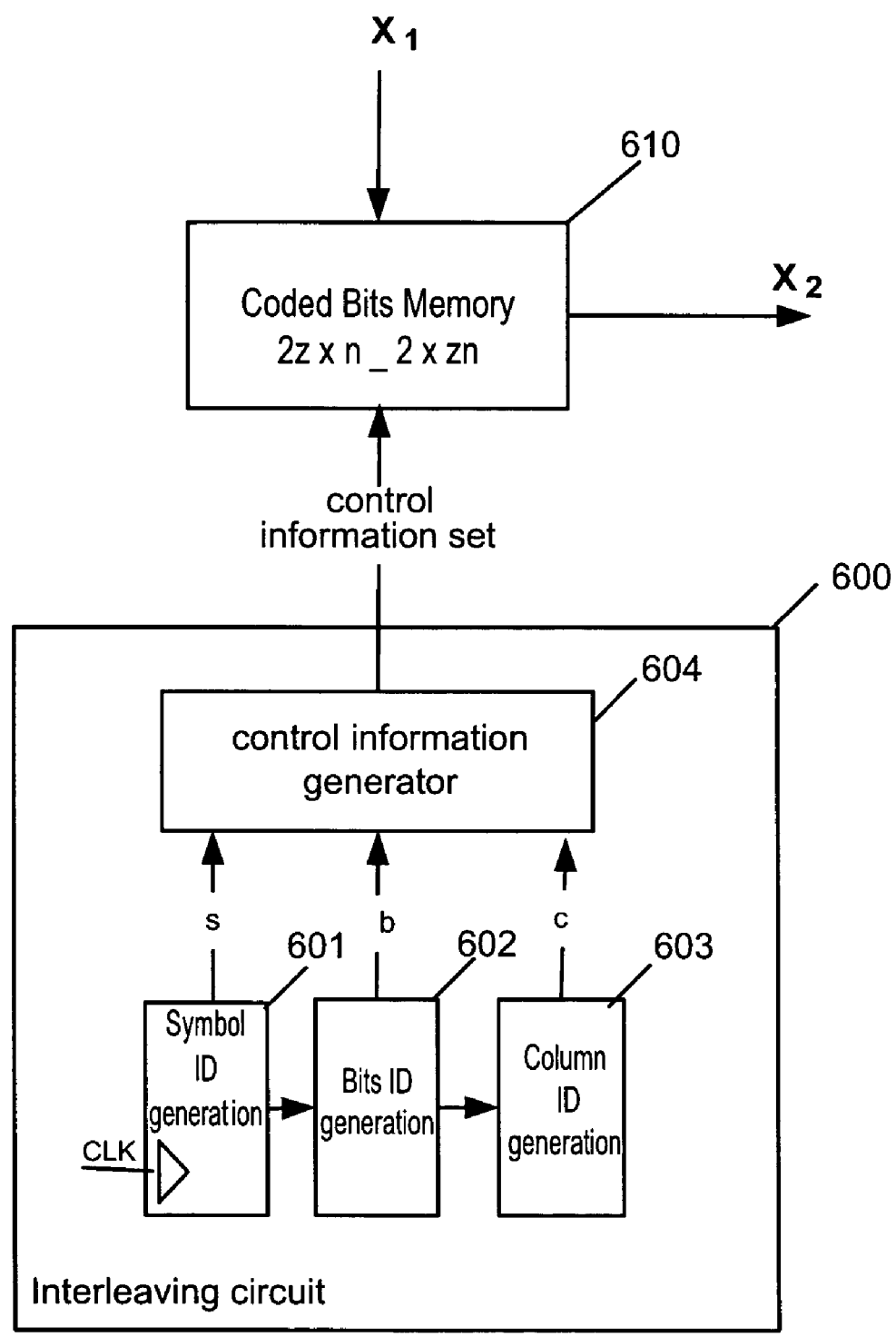
FIG. 6 illustrates an exemplary interleaver, suitable for use as the interleaver at the transmitter of the system shown in FIG. 1, which implements algebraic interleaving in accordance with the present invention.
Figure 7:
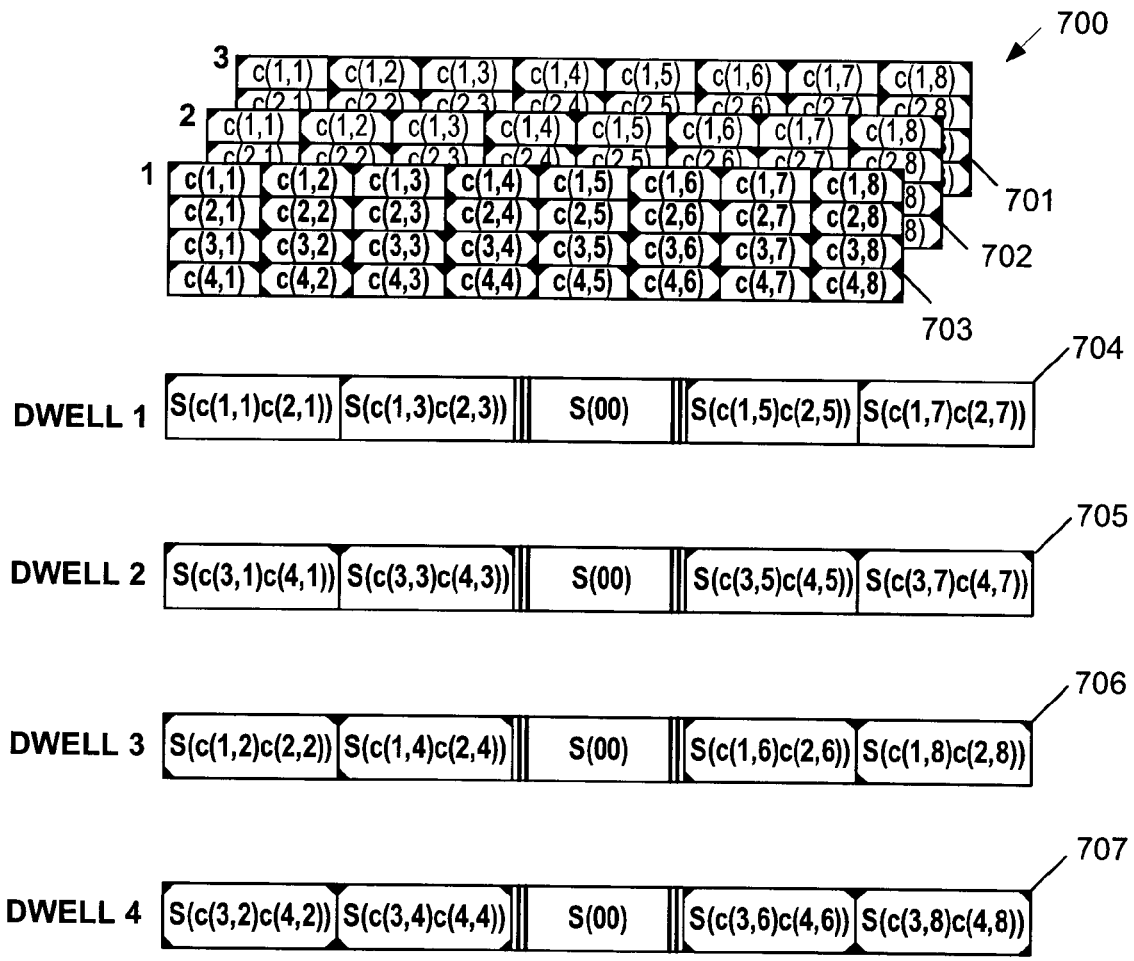
FIG. 7 illustrates the correspondence between soft values from the LDPC decoder and the transmission units using the exemplary code structure shown in FIG. 5. The soft values include 3 bits.
Figure 8:
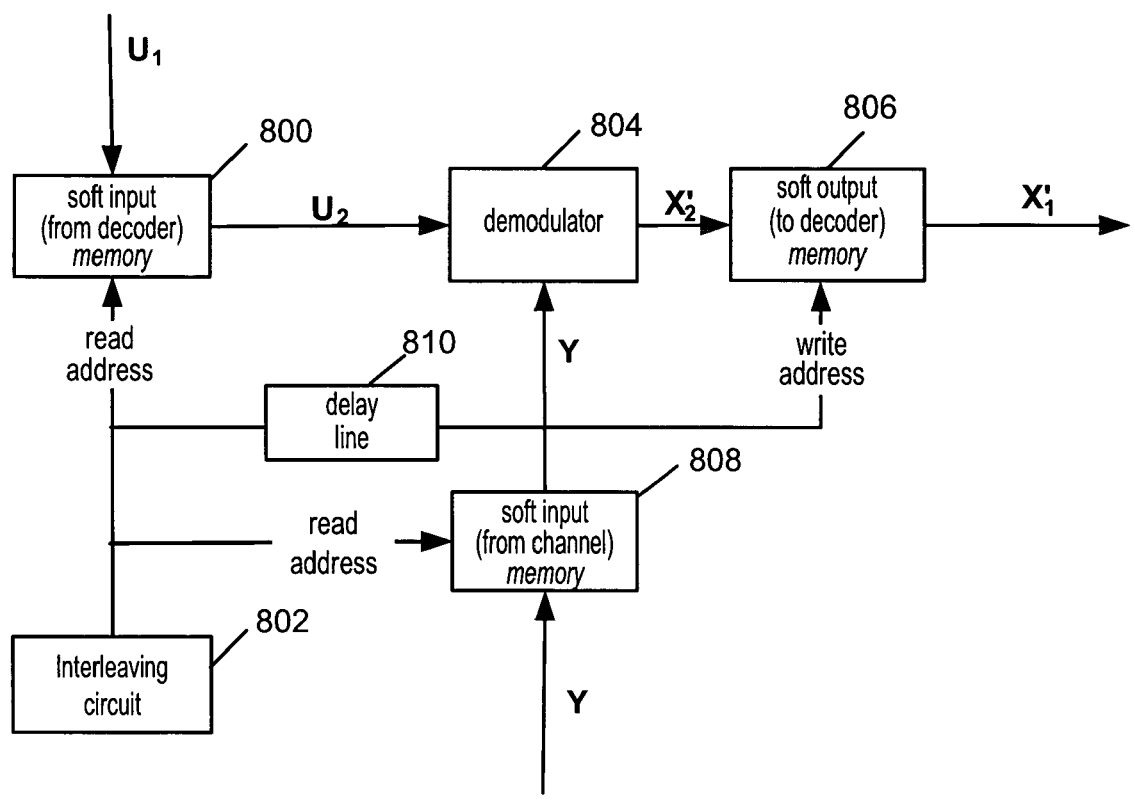
FIG. 8 illustrates an exemplary structure for applying interleaving and deinterleaving in iterative demodulation and decoding, suitable for use as the interleaver and the deinterleaver at the receiver of the system shown in FIG. 1.

FIG. 5 illustrates an exemplary interleaving structure for a coherent interval where L=5, M=4, and P=2. Array 500 represents coded bits that have been encoded by a vector-LDPC having Z=4 and n=8. The array may be stored in a corresponding structured array of memory locations. The coded bits 500 are stored with a 4×8 configuration where each element in the array 500 represents one bit; the bit at position (i,j) is denoted by c(i,j). Each dwell 501, 502, 503 and 504 will include 4 information symbols formed by using the bits of array 500. The proposed technique makes the first dwell 801 containing coded bits c(1,1), c(2,1), c(1,3), c(2,3), c(1,5), c(2,5), c(1,7), c(2,7). For ease of illustration, the exemplary modulation used is pseudo-pilot modulation so a dibit 00 is inserted into each dwell (at the middle) providing one of the 5 symbols in the dwell. Therefore, the first transmitted dwell is S(c(1,1)c(2,1)), S(c(1,3)c(2,3)), S(00), S(c(1,5)c(2,5)), S(c(1,7)c(2,7)) as shown in 501. Similarly, the second dwell 502 comprises S(c(3,1)c(4,1)), S(c(3,3)c(4,3)), S(00), S(c(3,5)c(4,5)), S(c(3,7)c(4,7)). And An apparatus, e.g., interleaver 102 of the invention, for the proposed interleaving technique is shown in FIG. 6. The interleaver 102 includes a memory 610 for storing coded bits and an interleaving circuit 600 coupled together as shown in FIG. 6. Interleaving circuit 600 generates a set of control information which is used to control the reading of dibits from the memory 610. Each set of generated control information includes a transmission unit identifier, a Z vector identifier, and a row identifier. Circuit 600 includes four components: a symbol ID generation module 601, a bits ID generation module 602, a column ID generation module 603 and a control information generator module 604. Module 601 is a repeating counter that generates a number s ranging from 0 to M−1. The counter 601 is incremented periodically as a function of a system clock clk, e.g., s is incremented once per clock cycle; number s determines the symbol index in a dwell. Module 602 is a repeating counter generating a number b ranging from 0 to z−1. The number b is periodically incremented each time the symbol index signal s reaches zero; number b determines the bits index in a selected column, e.g., the bit index of a column in array 600 which may be stored in memory 605. Module 603 is another counter. Module 603 generates a number c ranging from 0 to a−1. The number c is incremented each time the bits index b reaches zero; number c is the column index. Taking bits index b, symbol index s, and column index c, a control information generator module 604 produces a set of control information including a transmission unit identifier, a Z-vector identifier, and a row identifier used to control which location in the coded bits memory 605 is accessed. The Z-vector identifier is c+a×s, and the row identifier is 2×b. The transmission unit is identified by a transmission unit identifier having the value b+c×Z, where b and c are as defined above and where Z is the number of elements in each Z-vector and where x represent a multiplication operation.

At the receiver side, the direct mapping between data bits and transmission units is conformed for demodulation. We assume that soft-outputs from the decoder have the same ordering as the binary code word structure, e.g., as shown in array 600. The soft values includes, however, K bits corresponding to a coded bit. Each of K bits may be stored in a different one of D arrays where D is a positive integer. In most cases, K is an integer multiple of D. An exemplary memory 700 has three-bit soft values for each bit, each identified by the same code bit identifier. Those three bits might be in one memory location; or those three bits are in three different memory location 701, 702, 703, as shown in 700. With this structure, it is clear that the same interleaving circuit 600 can be used to access soft values for a transmission unit for demodulation.

Assuming the received values also conform to the same ordering as a code word, then again the same interleaving structure can be applied in the process of accessing received values for demodulation.

Inside turbo equalization, we assume that the soft-outputs from the vector-decoder (module 800) and soft-inputs from the channel receiver (module 808) have the same configuration as the coded bits, e.g., as shown in array 600. Entries in the above-mentioned configuration, however, will be K-bit integers instead of bits since they are soft messages. The interleaving circuit 802 may be the same as the circuit 600 shown in FIG. 6. The interleaving circuit 802 generates the correct address to access both soft-outputs from the decoder and soft-inputs from the channel in the ordering of dwells. The same generated addresses, subject to a delay introduced by a delay line 810, provide write addresses used to control the writing of the soft inputs to the decoder (module 806) after demodulation.

The above described method and method steps can be implemented using machine executable instructions, such as software, included in a machine readable medium such as a memory device, e.g., RAM, floppy disk, etc. to control a machine, e.g., general purpose computer with or without additional hardware, to implement all or portions of the above described methods, e.g., in one or more communications network nodes. Accordingly, among other things, the present invention is directed to machine-readable medium including machine executable instructions for causing a machine, e.g., processor and associated hardware, to perform one or more of the steps of the above-described method.

Numerous additional variations on the methods and apparatus of the present invention described above will be apparent to those skilled in the art in view of the above description of the invention. Such variations are to be considered within the scope of the invention. The methods and apparatus of the present invention may be, and in various embodiments are, used with CDMA, orthogonal frequency division multiplexing (OFDM), and/or various other types of communications techniques which may be used to provide wireless communications links between access nodes and mobile nodes. In some embodiments the access nodes are implemented as base stations which establish communications links with mobile nodes using OFDM and/or CDMA. In various embodiments the mobile nodes are implemented as notebook computers, personal data assistants (PDAs), or other portable devices including receiver/transmitter circuits and logic and/or routines, for implementing the methods of the present invention.

What is claimed is:

1. A method of processing a plurality of Z-vectors, each Z-vector including Z elements, each element including K bits, where Z is a positive integer greater than 1 and K is a positive integer, the plurality of Z-vectors corresponding to a binary codeword, portions of said binary codeword having a direct mapping relationship to a plurality of transmission units, said plurality of Z-vectors being stored in a set of D memory arrays, where D is an integer greater than zero, each memory array including Z rows of memory locations, each memory location of a row corresponding to a different array column, each array column corresponding to a different one of said plurality of Z-vectors, each Z-vector identifying one column in each of said D memory arrays, the method comprising:
   generating a series of sets of control information, each set of control information including:
      i) a Z-vector identifier;
      ii) a row identifier; and
   for at least one generated set of control information:
      reading P times K divided by D bits, where P is a positive integer, from each column identified by the Z-vector that is identified by the Z-vector identifier included in said at least one generated set of control information;
   wherein said method of processing is used to process received transmission units; and
   wherein K is an integer greater than zero arid is a number of bits used to represent a soft valve corresponding to one bit of said binary codeword.

2. The method of claim 1, wherein said binary codeword is a low density parity check codeword.

3. The method of claim 1,
   wherein D is 1; and
   wherein K is 1.

4. The method of claim 1, where D is equal to K or 1.

5. The method of claim 4, further comprising:
   for said at least one generated set of control information:
   supplying the P bits read from memory to a demodulator.

6. The method of claim 1, further comprising:
   for said at least one generated set of control information:
      generating, from said P bits read from memory, a portion of the transmission unit identified by the transmission unit identifier included in said generated set of control information.

7. The method of claim 6,
   wherein said plurality of Z-vectors includes n of said Z-vectors, where n is a positive integer greater than 1; and
   wherein generating a series of sets of control information further includes:
      incrementing a Z-vector identifier value n divided by M, where M is the number of portions of the transmission unit having a mapping relationship to a portion of the binary codeword said portion of the binary codeword including M times P bits.

8. The method of claim 6, wherein generating a series of sets of control information further includes:
   incrementing a row identifier value by P
   incrementing the Z-vector identifier value M times;
   after incrementing the Z-vector value M times:
      i) resetting the Z-vector identifier value to the Z-vector identifier value existing at the start of said incrementing; and
      ii) incrementing a row identifier value by P.

9. The method of claim 8, wherein generating a series of sets of control information further includes:
   after incrementing the row identifier value Z divided by P times, where Z divided by P times is an integer,
   setting the row identifier value to zero; and
   incrementing the Z-vector identifier value by a preselected positive integer value.

10. The method of claim 9, wherein said preselected positive integer value is one.

11. The method of claim 1,
    wherein said method of processing is performed by a transmission device prior to transmission of said transmission units;
    wherein D is 1; and
    wherein K is 1.

12. The method of claim 11, wherein said binary codeword is a low density parity check codeword.

13. The method of claim 11, further comprising:
    for said at least one generated set of control information:
       generating from said P bits read from memory, a portion of the transmission unit identified by the transmission unit identifier included in said at least one generated set of control information.

14. The method of claim 13, wherein generating a series of sets of control information further includes:
    incrementing the z-vector identifier value M times;
    after incrementing the z-vector value M times:
       i) resetting the z-vector identifier value to the z-vector identifier value existing at the start of said incrementing; and
       ii) incrementing a row identifier value by P.

15. The method of claim 14, wherein generating a series of sets of control information further includes:
    after incrementing the row identifier value Z divided by P times, where Z divided by P times is an integer,
    setting the row identifier value to zero; and
    incrementing the Z-vector identifier value by a preselected positive integer value.

16. The method of claim 15, wherein said preselected positive integer value is one.

17. A method of processing a plurality of Z-vectors, each Z-vector including Z elements, each element including K bits, where Z is a positive integer greater than 1 and K is a positive integer, the plurality of Z-vectors corresponding to a binary codeword, portions of said binary codeword having a direct mapping relationship to a plurality of transmission units, said plurality of Z-vectors being stored in a set of D memory arrays, where D is an integer greater than zero, each memory array including Z rows of memory locations, each memory location of a row corresponding to a different array column, each array column corresponding to a different one of said plurality of Z-vectors, each Z-vector identifying one column in each of said D memory arrays, the method comprising:

generating a series of sets of control information, each set of control information including:
i) a Z-vector identifier;
ii) a row identifier; and
for at least one generated set of control information:
reading P times K divided by D bits, where P is a positive integer, from each column identified by the Z-vector that is identified by the Z-vector identifier included in said at least one generated set of control information;
wherein said method of processing is performed by a transmission device prior to transmission of said transmission units;
wherein D is 1;
wherein K is 1;
for said at least one generated set of control information, generating from said P bits read from memory, a portion of the transmission unit identified by the transmission unit identifier included in said at least one generated set of control information;
wherein said plurality of Z-vectors includes n of said plurality of Z-vectors, where n is a positive integer greater than 1; and
wherein generating a series of sets of control information further includes:
incrementing a Z-vector identifier value by n divided by M, where H is the number of portions of the transmission unit having a direct mapping relationship to a portion of the binary codeword said portion of the binary codeword including M times P bits.

18. The method of claim 17,
wherein each portion of a transmission unit is a symbol; and
wherein the transmission unit is a dwell.

19. An apparatus for processing a plurality of Z-vectors, each Z vector including Z elements, each element including K bits, where Z is a positive integer greater than 1 and K is a positive integer, the plurality of Z vectors corresponding to a binary codeword, portions of said binary codeword having a direct mapping relationship to a plurality of transmission units, said apparatus comprising:

memory including a set of D memory arrays for storing said plurality of Z-vectors, where D is an integer greater than zero, each memory array including Z rows of memory locations, each memory location of a row corresponding to a different array column, each array column corresponding to a different one of said plurality of Z vectors, each Z-vector identifying one column in each of said D memory arrays;

memory access control module for generating a series of sets of control information, each set of control information including:
i) a Z-vector identifier;
ii) a row identifier; and
means for reading P times K divided by D bits, from said memory, where P is a positive integer greater than zero, from each column identified by the Z-vector that is identified by the Z-vector identifier included in at least one generated set of control information; and
wherein K is an integer greater than zero and is a number of bits used to represent a soft value corresponding to one bit of said binary codeword.

20. The method of claim 19, wherein said memory access control modules includes:
a first counter for generating said Z-vector identifier; and
a second counter for generating said row identifier.

21. A machine readable medium comprising machine executable instructions for controlling a computer device to process a plurality of Z-vectors, each Z-vector including Z elements, each element including K bits, where Z is a positive integer greater than 1 and K is a positive integer, the plurality of Z-vectors corresponding to a binary codeword, portions of said binary codeword having a direct mapping relationship to a plurality of transmission units, said machine executable instructions including instructions used to control the computer device to:

generate a series of sets of control information, each set of control information including:
i) a Z-vector identifier; and
ii) a row identifier; and
for at least one generated set of control information:
read P times K divided by D bits, where P is a positive integer greater than zero, from each column identified by the Z-vector that is identified by the Z-vector identifier included in said at least one generated set of control information; and
wherein K is an integer greater than zero and is a number of bits used to represent a soft value corresponding to one bit of said binary codeword.

* * * * *